(12) United States Patent
Greenberg

(10) Patent No.: US 7,825,715 B1
(45) Date of Patent: Nov. 2, 2010

(54) DIGITALLY TUNABLE CAPACITOR

(75) Inventor: Jody Greenberg, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/245,487

(22) Filed: Oct. 3, 2008

(51) Int. Cl.
*H03K 5/00* (2006.01)

(52) U.S. Cl. .................. 327/337; 327/554; 327/362

(58) Field of Classification Search ............. 327/94, 327/554, 172–175, 362, 337
See application file for complete search history.

(56) References Cited

U.S. PATENT DOCUMENTS

| | | | |
|---|---|---|---|
| 6,677,814 B2 * | 1/2004 | Low et al. ............. | 327/554 |
| 7,183,725 B2 * | 2/2007 | Kim ..................... | 315/291 |
| 7,375,597 B2 * | 5/2008 | Greenberg et al. ..... | 331/74 |
| 7,471,143 B2 * | 12/2008 | Kim ..................... | 329/312 |

* cited by examiner

*Primary Examiner*—Dinh T. Le

(57) ABSTRACT

The disclosed device can contain a pair of switchable capacitors, one of which has the larger capacitance of the pair. Each of the switchable capacitors can include a capacitor in series with a switch. Both switchable capacitors can be connected in a parallel circuit that has a tunable capacitance. The ratio of the capacitances of the pair can approximately equal a ratio of mutually prime integers. In a particular case, the ratio of capacitances can approximately equal a ratio of two consecutive integers. The capacitance ratio can be called a weight or weight ratio. A switch controller can drive the pair of switchable capacitors with a pair of (M+1)-ary pulse width modulated signals, each of which has the same modulation period.

26 Claims, 5 Drawing Sheets

DIGITALLY TUNABLE CAPACITOR

BACKGROUND

Tunable capacitors have numerous applications, including tunable oscillators, tunable filters, adjustable impedance matching circuits, capacitive sensors, variable delay circuits, data conversion circuits, radio frequency (RF) transmitters, and RF receivers. Tunable capacitors are frequently used in voltage-controlled oscillators (VCOs). Most applications that use a tunable capacitor adjust the capacitance by mechanical, electro-mechanical, or analog electronic techniques.

SUMMARY

Digitally tunable capacitors offer many advantages over analog tunable capacitors including precision, resolution, noise immunity, and manufacturability. Digitally tunable capacitors may be constructed from micro-electromechanical systems (MEMS) or switched capacitor (SC) circuits.

The SC type of digitally tunable capacitors can be constructed using individual capacitors that are connected to and disconnected from a set of terminals by digitally controlled switches. The digital control signals can adjust or tune the capacitance by digitally pulse-width modulating (PWMing) a capacitor by varying the duty cycle of a waveform that opens and closes a switch in series with a capacitor. Digital PWM can allow for an integer number of timeslots of a constant pulse width within each period of a clock. Digital PWM can be distinguished from analog PWM in which the pulse width can vary continuously from zero up to the clock period. Low-resolution SC digitally tunable capacitors can use a single capacitor and a switch that is operated by a digital PWM signal. The series connected capacitor and switch can be called a switchable capacitor.

The performance of a digitally tunable capacitor may be degraded by spurious signals from a digital tuning signal, low time resolution or low amplitude resolution of the digital tuning signal, and combinations of these and other factors. For example, spurious signals may be caused by a clock source having a pulse width step size or timeslot that is a large fraction of the period. A high-resolution pulse-width modulation (PWM) signal can avoid introducing significant spurious signals and can modulate or adjust the time-averaged or effective capacitance of a digitally tunable capacitor in fine steps, within limits set by the timeslot pulse width.

The resolution of a digitally controlled analog component, such as a digitally tunable capacitor used in a digitally controlled oscillator (DCO), may also be limited by component tolerances, minimum component values, parasitic resistances, parasitic inductances, parasitic capacitances, circuit topology, and combinations of these and other factors. For example, the resolution of a digitally tunable capacitor may be limited by the minimum capacitance value that can be manufactured with high manufacturing yield.

The resolution of a digitally tunable capacitor may be affected by non-uniform step sizes. For example, a digitally controlled multiplexer may select a capacitor from a bank of different-valued capacitors. The selected capacitance may not increase uniformly as the digital control code or address changes. The localized or small-scale non-uniform changes can be quantified as a non-zero differential non-linearity (DNL) in the relationship between the selected capacitance and the digital code. The large-scale non-uniformities that produce a deviation from a linear relationship between the selected capacitance and the digital code may be quantified as the integral non-linearity (INL) over a given range of digital codes.

DCOs have been constructed by combining a crystal oscillator and a programmable divider. The crystal oscillator is a combination of a crystal and an active circuit that drives the crystal at or near a crystal resonance frequency. Crystal oscillators are used when stable, low-phase noise, accurate clock reference signals are desired. Due to semiconductor technology constraints, crystals are bulky and cannot be readily integrated on a monolithic semiconductor chip.

High-resolution, digitally tunable capacitors may use either a large number of capacitors and switches, a widely varying range of capacitances, or both. Some high-resolution, digitally tunable capacitor designs may call for capacitors that are either too small to manufacture with acceptable yield or are too close in capacitance to the parasitic capacitances of the switches to effectively adjust the capacitance of a tuned circuit, such as an oscillator circuit.

Designs for high resolution, digitally tunable capacitors may use a PWM signal that is based on a high frequency master clock or a low frequency master clock. In either case, a conventional design goal is to provide short subintervals or timeslots within the period of the master clock. A high frequency or short-period master clock circuit can provide short timeslots but may violate the design rules for the chosen semiconductor technology. A low master clock frequency may have numerous timeslots within a longer period but may introduce spurious tuning signals or perturbations on time scales that cause phase noise in an oscillator that uses the digitally tunable capacitor. The performance of DCOs can be constrained by factors such as minimum or maximum manufacturable component values, the timeslot pulse width of the PWM signal, the PWM period, and other factors.

The disclosed device can contain a pair of switchable capacitors, one of which has the larger capacitance of the pair. Each of the switchable capacitors can include a capacitor in series with a switch. Both switchable capacitors can be connected in a parallel circuit that has a tunable capacitance.

Further, a ratio of the capacitances of the pair can approximately equal a ratio of mutually prime integers. In a particular case, the ratio of capacitances can approximately equal a ratio of two consecutive integers. The capacitance ratio can be called a weight.

Further, a switch controller can drive the pair of switchable capacitors with a pair of (M+1)-ary pulse width modulated signals, each of which can have the same modulation period. The integer M, can quantify the granularity of the pulse width modulated signals by determining the number of ON-states or timeslots.

The disclosed device can also include a pulse generator that is coupled to the switch controller. The pulse generator can generate the (M+1)-ary pulse width modulated signals and can tune the capacitance of the parallel circuit to equal a pre-determined capacitance.

In further aspects of the disclosed device, an offset switchable capacitor, which is coupled to the switch controller and in parallel with the pair of switchable capacitors, can also be included. The switch controller can drive the offset capacitor with an offset pulse width modulation signal having the same modulation period as the pair of switchable capacitors. The switch controller can also drive the offset capacitor fully ON so the capacitance of the offset capacitor is present at the terminals of the parallel network for the full duration of the modulation period. When the switch controller switches the offset switchable capacitor to a fully ON state, the tunable capacitance can equal a sum of the capacitance of the offset capacitor, the capacitance of the first capacitor of the pair times the duty cycle of the first pulse width modulated signal, and the capacitance of the second capacitor of the pair times the duty cycle of the second pulse width modulated signal. The offset capacitance can be an integer multiple of the first capacitance of the pair.

Further aspects of this disclosure describe an oscillator that can include a tunable oscillator circuit that can resonate at a tunable oscillator period. The oscillator can also include a pair of switchable capacitors, one of which has a capacitance that is larger than the first. The ratio of the capacitances can equal a ratio of mutually prime integers. In particular, the ratio can be a ratio of consecutive integers. Each of the switchable capacitors can include a capacitor in series with a switch.

Both switchable capacitors can be connected in a parallel circuit. The parallel circuit, which has a capacitance that is tunable, can be coupled to the tunable oscillator circuit. The tunable capacitance can adjust the tunable oscillator period or, equivalently, tune the oscillator frequency.

The tunable oscillator's switch controller can switch both switchable capacitors using (M+1)-ary pulse width modulated signals that have the same modulation period. The switch controller can act in accordance with the pulse generator to generate the pulse width modulated signals. The pulse width modulation signals can tune the parallel circuit to a pre-determined capacitance.

In additional aspects of this disclosure, the oscillator can also include an offset switchable capacitor that is controlled by the switch controller and connected in parallel with the switchable capacitor pair. The capacitance of the capacitor included in the offset switchable capacitor can be an integer multiple of the capacitance of the capacitor included in the first switchable capacitor.

The switch controller can switch the offset switchable capacitor with a pulse width modulation signal that has the same modulation period as the pair of switchable capacitors having unequal capacitance. When the switch controller switches the offset switchable capacitor ON for a full modulation period, the tunable capacitance equals the sum of the offset capacitance, the first capacitance times duty cycle product, and the second capacitance times duty cycle product.

Further aspects of this disclosure can include switchable capacitors that can be coupled to the tunable oscillator circuit, but not necessarily directly connected to the parallel circuit of the first pair of switchable capacitors. An additional switchable capacitor can be switched by the switch controller. The additional switchable capacitor can be connected in parallel with another switchable capacitor to form a second pair of switchable capacitors. Like the first pair of switchable capacitors, the capacitances of the second pair can be unequal. Both switchable capacitors of the second pair can be switched with (M+1)-ary pulse width modulated signals having the same modulation period as the first pair.

Aspects of this disclosure include a method of adjusting a tunable capacitance. The method can include generating pulse width modulation signals that can be characterized by individual, but not necessarily distinct, duty cycles and having the same modulation period. The disclosed method can also include switching switchable capacitors with the pulse width modulation signals to adjust the tunable capacitance. The switchable capacitors can be disposed in parallel and can have capacitances that have a weight ratio that is a ratio mutually prime integers.

The disclosed method can also include generating a sequence of duty cycles of the pulse width modulation signals that correspond to monotonically increased values of the tunable capacitance. The disclosed method can further include selecting the duty cycles from the sequence of duty cycles based on a desired capacitance.

The sequence of duty cycles can include sub-sequences in which a second duty cycle decreases when a first duty cycle increases. In an advantageous case, an increase in the first duty can be given by 1/M, where M is the pulse width modulation signal granularity.

BRIEF DESCRIPTION OF THE DRAWINGS

The disclosure will make reference to the accompanying figures, wherein like numerals represent like elements, and wherein.

DETAILED DESCRIPTION OF EMBODIMENTS

Figure 1:
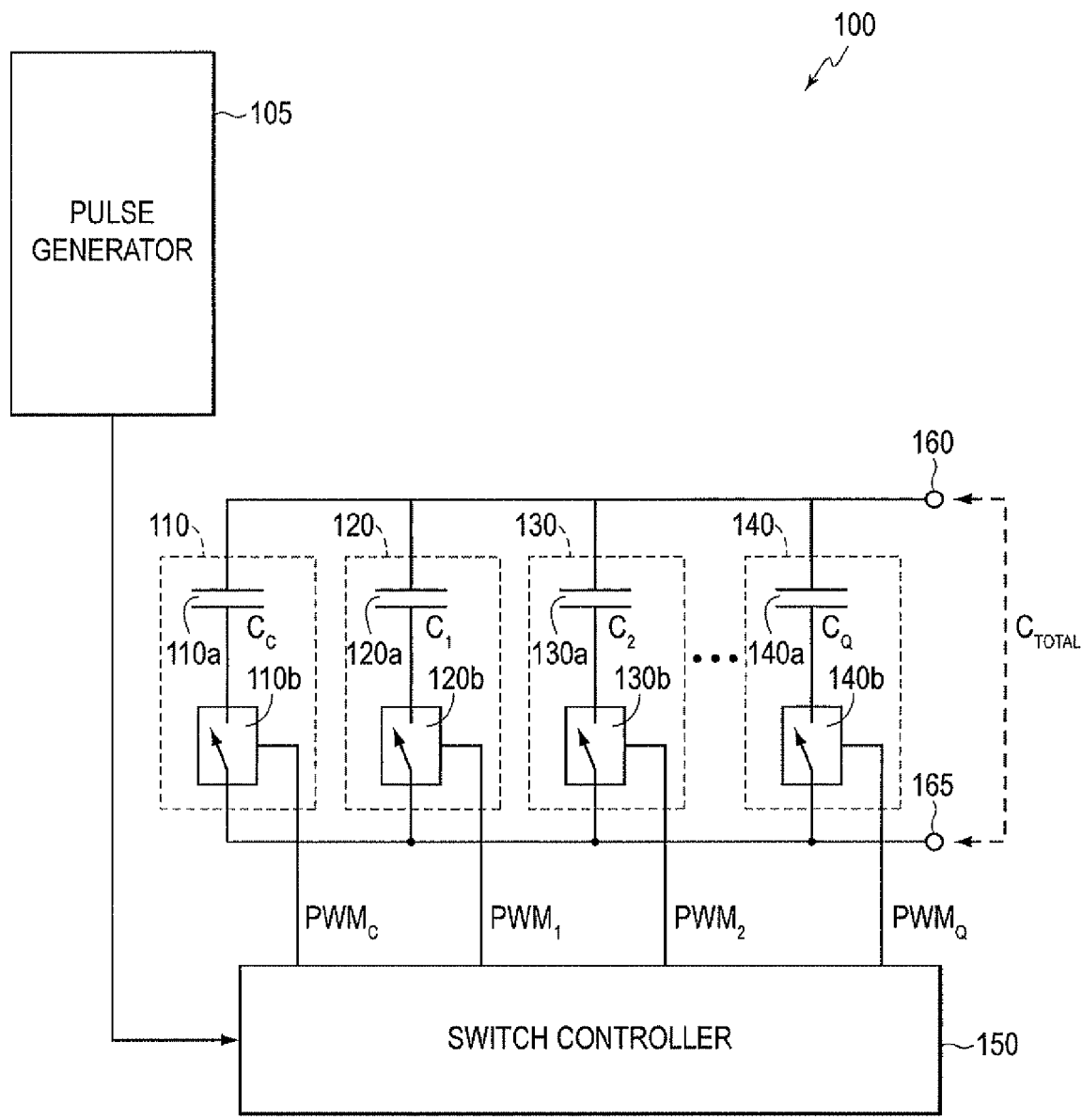
FIG. 1 shows an exemplary digitally tunable capacitor containing a pulse generator, a main or fractional capacitor, a main or fractional switch, Vernier or fine capacitors, Vernier or fine switches, and a switch controller.

FIG. 1 shows an exemplary digitally tunable capacitor 100 containing a pulse generator 105, a main or fractional switchable capacitor 110, Vernier or fine switchable capacitors 120, 130, and 140, and a switch controller 150. As shown, fractional switchable capacitor 110 can include a fractional capacitor 110a and fractional switch 110b that can be connected in series, and fine switchable capacitors 120, 130 and 140 can include fine capacitors 120a, 130a, and 140a, which can be connected in series with fine switches 120b, 130b, and 140b, respectively. Each switchable capacitor, i.e., each capacitor and its series connected switch, can form a branch of a parallel circuit of series-connected capacitors and switches. The total effective capacitance of the digitally tunable capacitor 100 can be presented at terminals 160 and 165 and can have a time-averaged value, $C_{TOTAL}$, that can be substantially equal to a desired capacitance. The desired capacitance can be set by the pulse generator 105. The total effective tunable capacitance $C_{TOTAL}$, may be a periodically time-averaged capacitance. The time average can occur over the period of a clock signal that sets the repetition rate of a digital pulse width modulation (PWM) signal. In other words, the PWM signal can control the time average of the capacitance so that changes in the PWM signal can vary the tunable capacitance.

The pulse generator 105 can supply the clock signal and control signals to the switch controller 150. The pulse generator 105 can be a dedicated or embedded controller within an integrated circuit, a microprocessor, a digital signal processor, a programmable gate array, an analog to digital converter combined with a lookup table, and the like.

The clock signal from pulse generator 105 can be a digital clock signal, such as a non-return to zero (NRZ) signal, a return to zero (RZ) signal, and the like. The frequency of the clock signal may be chosen to operate the digitally tunable capacitor 100 with high resolution without generating phase noise or spurious signals in oscillators and other applications. Pulse generator 105 can supply more than one clock signal. The period of each clock signal need not be the same. Pulse generator 150 can supply control signals to independently adjust the period and duty cycle of pulse width modulation (PWM) waveforms from the switch controller 150. The PWM waveforms can open and close fractional and fine switches 110b and 120b-140b, respectively, to change the time-averaged effective capacitance, $C_{TOTAL}$, presented between terminals 160 and 165.

The control signals from pulse generator 105 can be based on configuration or pattern generation tables, such as sequences of PWM duty cycles, start and stop signals, and the like. In other words, the control signals can indirectly control each PWM waveform generated by switch controller 150 so that the switch controller 150 subsequently repeats the PWM waveforms according to PWM periods and duty cycles as commanded by the pulse generator 105.

The control signals from pulse generator 105 can drive the PWM pattern from pattern generator 150 directly. In this case, the pulse generator 105 can act as a switch driver or switching signal amplifier or a power amplifier. Pulse generator 105 may supply the clock and control signals to pattern generator 150 via a parallel digital bus, a set of serial digital lines, a single time-multiplexed digital line, and the like.

The switch controller 150 can receive the clock and control signals and can supply a pulse width modulated (PWM) waveform, $PWM_C$, to the fractional switch 110b. The switch controller 150 may also supply a $PWM_1$ waveform to the fine switch 120b, a $PWM_2$ waveform to the fine switch 130b, and a $PWM_Q$ waveform to the fine switch 140b, where the symbol Q can denote a total number of fine capacitors. Each PWM waveform can switch a fractional or fine switch 110b-140b from open to closed and vice versa. Each closed switch can connect a fractional or fine capacitor to terminals 160 and 165 through a low impedance path. The impedance of each switch may include an ON resistance and a parasitic capacitance.

Each PWM waveform from switch controller 150 can be a digital pulse width modulation (PWM) signal in which the period of a clock signal is quantized or discretized into an integer number of subintervals or timeslots. The timeslots may or may not be of equal duration. The sum of all timeslot durations substantially equal the period of the clock. When the timeslots are of equal duration, each timeslot can have a timeslot pulse width that is a sub-multiple of the period. In other words, the timeslot pulse width can be the clock period divided by a positive integer. For example, a PWM signal having 32 timeslots and a 1024 nanosecond (ns) period may be divided into timeslots of 32 (ns) each.

Each PWM waveform can vary the duty cycle of a switch 110b-140b between 0% and 100%. In some cases, a PWM signal may be held at 0% or 100% so the corresponding switch is fully OFF or ON, respectively for one or more PWM periods. The period of each PWM waveform can be different and may be independently adjusted by the pulse generator 105.

When the timeslots of the PWM waveforms from switch controller 150 are of equal duration and the PWM waveforms have a common period, the duty cycle of the PWM waveforms supplied to the fractional capacitor 110a and fine capacitors 120a, 130a, and 140a, can be adjusted in M increments between 0% and 100% by pattern generator 150. In this case, there can be M+1 possible duty cycles, including 0%, for each PWM waveform. The value of M may be a power of two such as 2, 4, 8, 16, 32, and so on.

The fractional capacitor 110a can be an integrated capacitor, such as a metal capacitor with a silicon dioxide insulator, a plate capacitor, a sandwich capacitor, an inter-digitated capacitor, a polysilicon capacitor, and the like, or a discrete capacitor, such as a ceramic, polystyrene, tantalum, electrolytic capacitor, and the like. The capacitance of the fractional capacitor 110 can be substantially unequal to the capacitance of one or more of the fine capacitors 120, 130, or 140.

The fine capacitors 120-140 can also be an integrated capacitor or a discrete component. The fine capacitors 120-140 can be integrated on a single semiconductor chip along with the fractional capacitor 110a, however, any of the fractional or fine capacitors 110a or 120a-140a, respectively, may be a discrete capacitor located off-chip.

The fractional and fine switches, 110b and 120b-140b, respectively, can be integrated switches, such as metal oxide semiconductor field effect transistors (MOSFETs), bipolar junction transistors (BJTs), junction field effect transistors (JFETs), and the like. Each switch 110b-140b can implement a single pole single throw (SPST) function. Each switch 110b-140b can be an open circuit or a hard-wired connection when the corresponding PWM waveform is fixed to 0% or 100% duty cycle, respectively. A capacitor that is continuously connected to output terminals 160 and 165 can be called an offset capacitor. An offset capacitor can be a switchable capacitor, such as switchable capacitors 130 and 140, or a fixed capacitor that is always switched ON, such as switchable capacitors 130 and 140 with a fully ON PWM waveform or a closed switch, such as fine switches 130b and 140b.

The fractional and fine switches, 110b and 120b-140b, respectively, can have a low impedance magnitude over a frequency band for which the impedance of each corresponding capacitor 110-140 has substantially capacitive reactance. In an advantageous case, the impedance of each switch 110b-140b can be a small, ideally zero, resistance so the total impedance between terminals 160 and 165 is substantially capacitive for frequencies of interest.

Each capacitor 110a-140a can contribute a weighted amount of capacitance to $C_{TOTAL}$ and, when each PWM waveform has a common period, each contribution can be selected from M+1 weights. For example, when a 33-ary PWM signal is used, there may be 32 timeslots and 33 weights, corresponding to duty cycles, from 0, 1/32, 2/32, . . . , up to 1. Accordingly, when a single fractional capacitor and Q fine capacitors are used, the total desired capacitance, $C_{DESIRED}$, can be selected from a set of $(M+1)^{Q+1}$, not necessarily distinct, possible values. A given achieved or realized total capacitance, $C_{TOTAL}$, can be obtained in more than one way; i.e., more than one set of PWM waveforms or duty cycles may achieve the same $C_{TOTAL}$.

In some applications, it may be advantageous to apply PWM signals to two or more of the capacitances in digitally tunable capacitor 100 simultaneously. For example, it may be advantageous to pulse width modulate the fractional capacitor 110a, with a pulse width modulated or $PWM_C$ waveform and fine capacitor 120a ($C_1$) with $PWM_1$ while leaving both fine capacitor 130 ($C_2$) and fine capacitor 140a ($C_Q$) either fully ON or fully OFF. In other words, the fine switches 130b and 140b can allow fine capacitors 130a and 140a to either fully contribute or not contribute to the total capacitance $C_{TOTAL}$ while the fractional switch 110b and the fine switch 120b can be pulse width modulated so fractional capacitor 110a and fine capacitor 120a contribute given but variable amounts to the total capacitance.

Figure 2A:
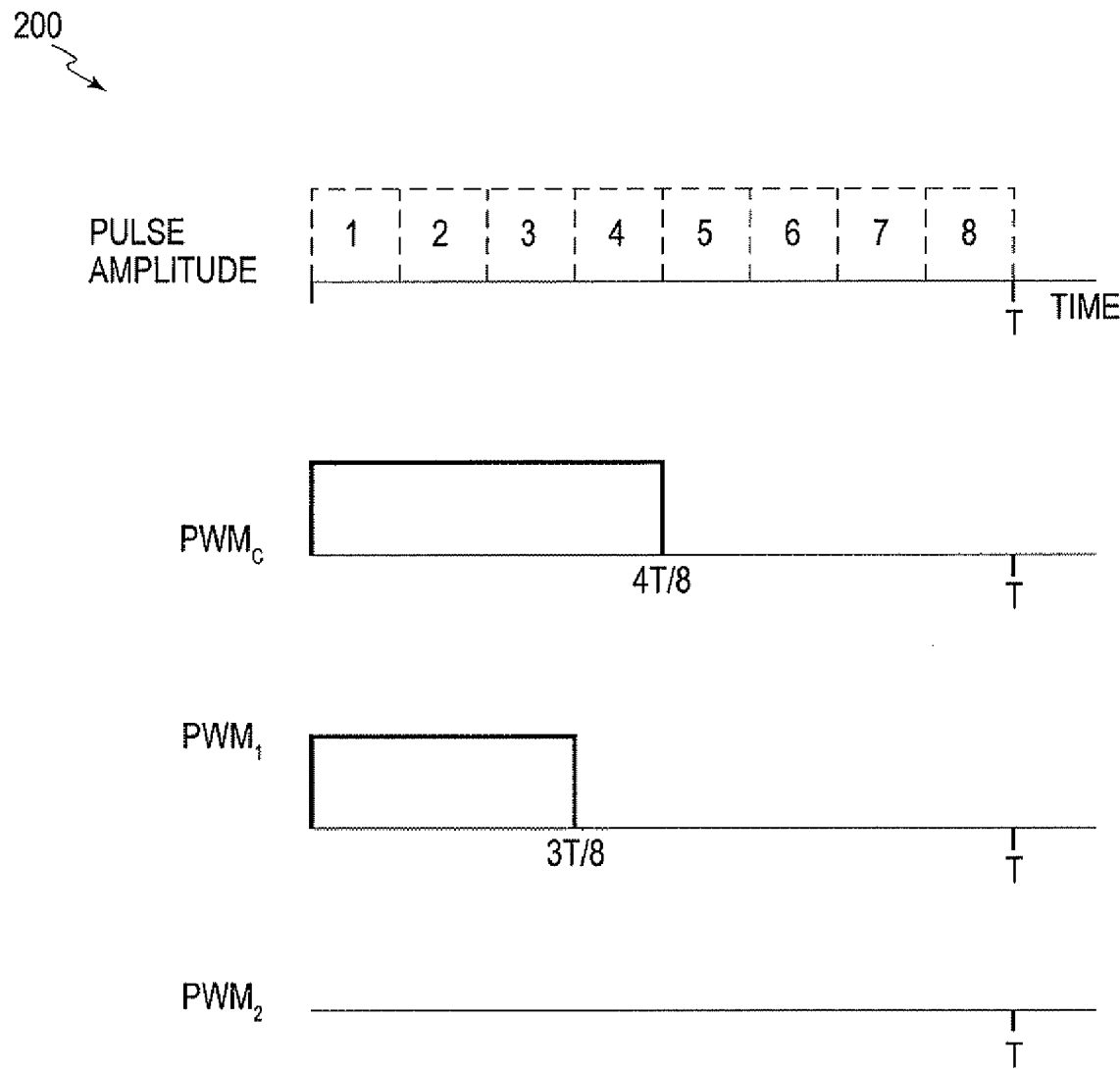
FIG. 2a is a diagram of an exemplary set of pulse width modulation (PWM) waveforms in which a fractional capacitor is pulse width modulated with a duty cycle of 50% while first and second fine capacitors are pulse width modulated at 37.5% and 0%, duty cycle, respectively.

FIG. 2a is a diagram of an exemplary set of pulse width modulation (PWM) waveforms. In this exemplary case, there are two fine capacitors, each of an equal size denoted by $C_0$. The capacitance of a fractional capacitor, such as fractional capacitor 110, can be larger or smaller than the capacitance of a fine capacitor by a factor of $(1+1/R)$ or $(1-1/R)$, respectively, where R denotes an increase in the resolution of a digitally tunable capacitance that includes a fractional capacitor and a fine capacitor. For example, when R equals 4, which corresponds to a two bit increase in the resolution, the capacitance of a fractional capacitor can be 1.25 times the capacitance of a fine capacitor as shown in EQ. 1.

$$C_C = (1+1/R)C_0 = 1.25 C_0 \qquad \text{EQ. 1}$$

The total capacitance, $C_{TOTAL}$, which can be a periodically time-averaged capacitance, can be a weighted sum of the capacitance of the fractional capacitor 110 and the fine capacitors 120-130. Each weight coefficient can approximately equal the duty cycle of each pulse width modulated (PWM) waveform. In other words, each weight coefficient can be a PWM pulse width divided by the period of the PWM waveform. In FIG. 2a, the PWM waveform for the fractional capacitor, $PWM_C$, is shown as 4/8 of the clock period, while the $PWM_1$ waveform for the first fine capacitor is shown as 3/8 of the clock period. In this case, $PWM_2$ is OFF and has 0% duty cycle. In this case, the periodically time-averaged total capacitance, $C_{TOTAL}$, can be substantially equal to $C_0$ as shown in EQ. 2.

$$C_{TOTAL} = 4/8(1.25 C_0) + 3/8 C_0 = C_0 \qquad \text{EQ. 2}$$

Figure 2B:
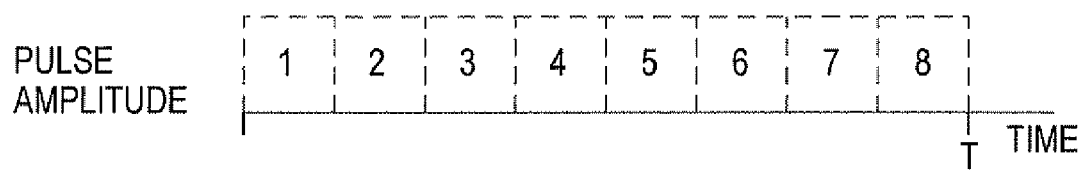
FIG. 2b is a diagram of an exemplary set of pulse width modulated waveforms in which a fractional capacitor is pulse width modulated with a duty cycle of 12.5% while first and second fine capacitors are pulse width modulated at 100% and 37.5% duty cycle, respectively.
Figure 2B:
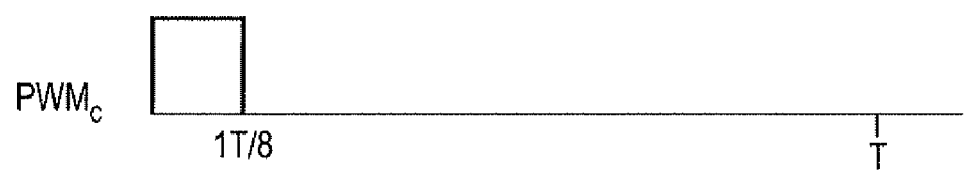
Figure 2B:
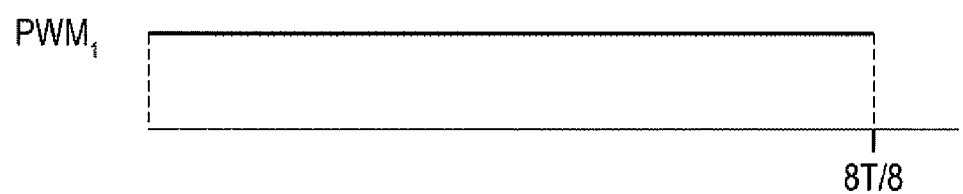
Figure 2B:
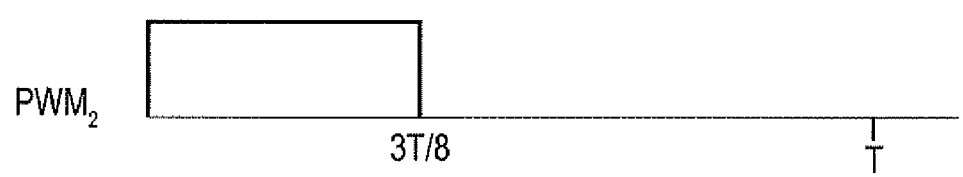

FIG. 2b is a diagram of an exemplary set of pulse width modulated waveforms in which a fractional capacitor is pulse width modulated with a duty cycle of 1/8 while first and second fine capacitors, such as fine capacitor 120-130, are pulse width modulated at 100% duty cycle (8/8) and 37.5% duty cycle (3/8), respectively. In this case, if the resolution increase factor R equals four, and the fractional capacitor is equal to 1.25 times the capacitance of the fine capacitors, $C_0$, then the total capacitance can be substantially equal to 49/32 times $C_0$ as shown in EQ. 3.

$$C_{TOTAL} = 1/8(1.25 C_0) + 8/8 C_0 + 3/8 C_0 = 49/32 C_0 \qquad \text{EQ. 3}$$

FIGS. 2a and 2b show modulation of a pair of capacitors, e.g., the fractional capacitor and a fine capacitor, while remaining fine capacitors are either OFF or ON and have either 0% or 100% duty cycle, respectively. When viewed as a series of snapshots, FIGS. 2a and 2b show one and zero fine capacitors being left OFF, respectively. In other words, a switch controller, such as switch controller 150, can sequentially activate or modulate switches, such as switches 110b-130b, that connect fine capacitances or capacitors to output terminals, such as terminals 160 and 165.

FIGS. 2a and 2b show the PWM signals that can drive two fine capacitors that are equal in capacitance, but are unequal to the capacitance of a fractional capacitor. In this example and others, the fractional capacitor can be a parallel combination of switched capacitors. The differences in the capacitances may be a small fraction of either capacitance. The capacitance of the fractional capacitor does not need to be smaller than that of a given fine capacitor, only different by a fraction of the fine capacitor.

Table 1 below shows an exemplary pulse width modulation pattern or sequence for a set of nine states, i.e., 9-ary PWM waveforms with 8 nonzero states and one all zero state. As can be seen, the three 9-ary PWM waveforms can drive one fractional capacitor, such as fractional capacitor 110 and two equal valued fine capacitors, such as fine capacitors 120-140.

The resolution increase factor, R, used in Table 1 can increase the capacitance of the fractional capacitor to 1.25 times that of each fine capacitor. The pattern of modulation codes, which can correspond to a sequence of duty cycles, shown in Table 1 can be those patterns or codes for which the increments in total capacitance are substantially the same, $C_0/(8R)$. The modulation codes can uniquely determine the duty cycle of a PWM waveform.

Table 1 includes six columns. The first column is a row counter for locating table entries. The second column, labeled fractional PWM, indicates the number of timeslots out of the total that the fractional capacitor is switched on. For example, if the fractional capacitor is switched on for 3 timeslots out of 8, then the duty cycle is 0.375. The PWM code or modulation code for each of the two fine capacitors shown in Table 1 are shown in the third and fourth columns of Table 1 and are labeled first PWM and second PWM, respectively. The duty cycle of each corresponding PWM waveform can be determined by each modulation code. The duty cycles and corresponding codes can be arranged in a sequence in which a desired tunable capacitance increases monotonically. The fifth column of Table 1 shows a weighted PWM value that equals the pulse widths of the first and second PWM signals plus the PWM value from column 1 weighted by 1.25. The sixth column of Table 1, labeled $C_{TOTAL}/C_0$, shows the normalized weighted capacitance, which is the weighted PWM value divided by 8 corresponding to the eight time slots in a 9-ary PWM signal. The normalized total capacitance can be the periodically time averaged capacitance presented at the terminals of a digitally tunable capacitor, such as terminals 160 and 165.

The first row of data in Table 1 shows the fractional capacitor is OFF, the first fine capacitor has a duty cycle of 3/8, and the second capacitor is OFF. The resulting weighted PWM value is three, indicating that the periodically time averaged value of the total capacitance is 3/8 times the capacitance of a fine capacitor. The second row of Table 1 shows the duty cycle of the fractional capacitor is 1/8, the duty cycle of the first capacitor is 2/8, and the second fine capacitor is switched OFF. The modulation code values in row 2 of Table 1 increase the weighted PWM value by 0.25 compared with the previous row. It should be understood that this increase of 0.25 corresponds to 1/4 of the change that would have occurred if the duty cycle of only one fine capacitor had been increased by 1/8. In other words, comparing the first and second rows of data, when the state of the fractional capacitor, which has a larger capacitance than the first fine capacitor in this example, is increased by one timeslot or modulation code unit so that the corresponding duty cycle increases by the reciprocal of the granularity, and the state of the first fine capacitor can be decreased by one timeslot, then the weighted PWM value may increase by 0.25 as shown in the fifth column of Table 1. The sequence of tabulated duty cycles in a pattern table can include such sub-sequences in which one modulation code or corresponding duty cycle increments and another modulation code and corresponding duty cycle decrements. As shown from Table 1, the weighted PWM value can increase monotonically with substantially equal step sizes when using PWM signals with a common period. The desired weighted PWM value or normalized capacitance can be achieved by selecting a state for each switchable capacitor from the M+1 states of (M+1)-ary PWM signals having a common period. Each (M+1)-ary PWM signal can have one of M possible nonzero states plus a zero state, thus achieving duty cycles from 0 to 100%. The (M+1)-ary descriptor used in this disclosure follows the convention for naming signals based on the number of states, e.g., binary, trinary or ternary, quaternary, M-ary, etc.

TABLE 1

PWM Code Pattern for 9-ary PWM and R = 4 resolution increase. The codes shown are those for which the weighted sum PWM and total capacitance step sizes are substantially equal.

| Row Number | Fractional PWM | 1st PWM | 2nd PWM | Weighted PWM | $C_{Total}/C_0$ |
|---|---|---|---|---|---|
| 1 | 0 | 3 | 0 | 3.00 | 0.375 |
| 2 | 1 | 2 | 0 | 3.25 | 0.406 |
| 3 | 2 | 1 | 0 | 3.50 | 0.438 |
| 4 | 3 | 0 | 0 | 3.75 | 0.469 |
| 5 | 0 | 4 | 0 | 4.00 | 0.500 |
| 6 | 1 | 3 | 0 | 4.25 | 0.531 |
| 7 | 2 | 2 | 0 | 4.50 | 0.563 |
| 8 | 3 | 1 | 0 | 4.75 | 0.594 |
| 9 | 4 | 0 | 0 | 5.00 | 0.625 |
| 10 | 1 | 4 | 0 | 5.25 | 0.656 |
| 11 | 2 | 3 | 0 | 5.50 | 0.688 |
| 12 | 3 | 2 | 0 | 5.75 | 0.719 |
| 13 | 0 | 6 | 0 | 6.00 | 0.750 |
| 14 | 1 | 5 | 0 | 6.25 | 0.781 |
| 15 | 2 | 4 | 0 | 6.50 | 0.813 |
| 16 | 3 | 3 | 0 | 6.75 | 0.844 |
| 17 | 0 | 7 | 0 | 7.00 | 0.875 |
| 18 | 1 | 6 | 0 | 7.25 | 0.906 |
| 19 | 2 | 5 | 0 | 7.50 | 0.938 |
| 20 | 3 | 4 | 0 | 7.75 | 0.969 |
| 21 | 4 | 3 | 0 | 8.00 | 1.000 |
| 22 | 1 | 7 | 0 | 8.25 | 1.031 |
| 23 | 2 | 6 | 0 | 8.50 | 1.063 |
| 24 | 3 | 5 | 0 | 8.75 | 1.094 |
| 25 | 4 | 4 | 0 | 9.00 | 1.125 |
| 26 | 5 | 3 | 0 | 9.25 | 1.156 |
| 27 | 2 | 7 | 0 | 9.50 | 1.188 |
| 28 | 3 | 6 | 0 | 9.75 | 1.219 |
| 29 | 4 | 5 | 0 | 10.00 | 1.250 |
| 30 | 5 | 4 | 0 | 10.25 | 1.281 |
| 31 | 6 | 3 | 0 | 10.50 | 1.313 |
| 32 | 3 | 7 | 0 | 10.75 | 1.344 |
| 33 | 4 | 6 | 0 | 11.00 | 1.375 |
| 34 | 5 | 5 | 0 | 11.25 | 1.406 |
| 35 | 6 | 4 | 0 | 11.50 | 1.438 |
| 36 | 7 | 3 | 0 | 11.75 | 1.469 |
| 37 | 4 | 7 | 0 | 12.00 | 1.500 |
| 38 | 1 | 8 | 3 | 12.25 | 1.531 |
| 39 | 2 | 8 | 2 | 12.50 | 1.563 |
| 40 | 3 | 8 | 1 | 12.75 | 1.594 |
| 41 | 4 | 8 | 0 | 13.00 | 1.625 |
| 42 | 1 | 8 | 4 | 13.25 | 1.656 |
| 43 | 2 | 8 | 3 | 13.50 | 1.688 |
| 44 | 3 | 8 | 2 | 13.75 | 1.719 |
| 45 | 4 | 8 | 1 | 14.00 | 1.750 |
| 46 | 1 | 8 | 5 | 14.25 | 1.781 |
| 47 | 2 | 8 | 4 | 14.50 | 1.813 |
| 48 | 3 | 8 | 3 | 14.75 | 1.844 |
| 49 | 4 | 8 | 2 | 15.00 | 1.875 |
| 50 | 5 | 8 | 4 | 15.25 | 1.906 |
| 51 | 2 | 8 | 5 | 15.50 | 1.938 |
| 52 | 3 | 8 | 4 | 15.75 | 1.969 |
| 53 | 4 | 8 | 3 | 16.00 | 2.000 |
| 54 | 7 | 8 | 7 | 16.25 | 2.031 |
| 55 | 2 | 8 | 6 | 16.50 | 2.063 |
| 56 | 3 | 8 | 5 | 16.75 | 2.094 |
| 57 | 4 | 8 | 4 | 17.00 | 2.125 |
| 58 | 5 | 8 | 3 | 17.25 | 2.156 |
| 59 | 2 | 8 | 7 | 17.50 | 2.188 |
| 60 | 3 | 8 | 6 | 17.75 | 2.219 |
| 61 | 4 | 8 | 5 | 18.00 | 2.250 |
| 62 | 5 | 8 | 4 | 18.25 | 2.281 |
| 63 | 6 | 8 | 3 | 18.50 | 2.313 |
| 64 | 3 | 8 | 7 | 18.75 | 2.344 |
| 65 | 4 | 8 | 6 | 19.00 | 2.375 |
| 66 | 5 | 8 | 5 | 19.25 | 2.406 |
| 67 | 6 | 8 | 4 | 19.50 | 2.438 |
| 68 | 7 | 8 | 3 | 19.75 | 2.469 |
| 69 | 4 | 8 | 7 | 20.00 | 2.500 |

In Table 1, the pattern of increasing the fractional capacitor's duty cycle by one unit and decreasing the first fine capacitor's duty cycle by one unit can continue until either a fine capacitor or the fractional capacitor is operated at 0% duty cycle. Thereafter, an additional increase by a weighted PWM value of 0.25 can be achieved by a simultaneous, compensatory adjustment of the duty cycle of both the fractional and a fine capacitor. For example, in data rows 9 and 10, the duty cycle of the first fine capacitor is increased from 0% to 50%, while the duty cycle of the fractional capacitor is decreased from 50% to 12.5%. This pattern of simultaneously adjusting two capacitors can continue until the duty cycle of either the fractional capacitor or a fine capacitor is 100%.

Subsequent increases in the total capacitance can be achieved by switching a fine capacitor fully ON and maintaining a 100% duty cycle, while pulse width modulating one or more other capacitors using variable duty cycles as determined by a desired capacitance. In other words, a fine capacitor may be recruited to serve as an offset capacitor and the simultaneous changes in the fractional capacitor and other fine capacitors can provide additional, high resolution increases in the total capacitance. For example, the last row of Table 1 shows 50% duty cycle for the fractional, 100% for the first fine, and 87.5% for the second fine capacitor. The weighted pulse width modulated value shown in the last row of Table 1 is 20, which yields a normalized total capacitance of 2.5 times the capacitance of a fine capacitor.

Table 1 shows a wide range over which the capacitance changes have a substantially equal step size. The capacitance change or steps for a digitally tunable capacitor, such as digitally tunable capacitor 100 which is modulated according to the pattern in Table 1, is a function of the number of fine capacitors. For example, when one, two, three, or four fine capacitors of equal capacitance are pulse width modulated with 9-ary PWM, the compensatory, substantially simultaneous adjustments of total capacitance obtained with the digitally tunable capacitor method of this disclosure can produce smaller capacitance step sizes than another method, called the thermometer method, that adds capacitances sequentially to a parallel circuit of fine capacitors.

TABLE 2

A comparison of the resolution of the Digitally Tunable Capacitor Method (DTC) and the Thermometer Method for 9-ary PWM

| Number of Fine Capacitors in Parallel Circuit | DTC Method (R = 4) | Thermometer Method |
|---|---|---|
| 1 | 1/32 | 1/8 |
| 2 | 1/64 | 1/16 |
| 3 | 1/96 | 1/24 |
| 4 | 1/128 | 1/32 |

It should be noted that Table 1 shows the relationship between modulation code patterns and the normalized total capacitance for an example in which the capacitances and ratio of the fractional and fine capacitances, are precisely known. When the capacitances are not precisely known, then either 1) capacitance measurements or 2) design level tolerancing of the capacitance of realizable capacitors can be used. The measured or approximate capacitance values can enable an advantageous construction of pattern or modulation code tables for digitally tunable capacitors per this disclosure. In other words, when the capacitances are approximately known, a modulation code pattern table can be constructed that monotonically increases the tunable capacitance with small step sizes. The ratio or ratios of measured capacitances can be approximated as a ratio of mutually prime integers using the extended Euclidean algorithm.

There are many applications for the disclosed digitally tunable capacitor. Some of the applications include a temperature compensated clock reference chip in which a temperature sensor signal can be used to derive a capacitance adjustment signal that, in turn, causes an otherwise temperature sensitive clock reference chip to make compensatory frequency adjustments, thus reducing the temperature dependence of oscillator frequency. For example, using 9-ary PWM and R=4, a digitally tunable capacitor that includes one fractional capacitor and 32 fine capacitors can tune a 1.000 GHz oscillator to 0.999 or 1.001 GHz in one step.

Additional applications for the disclosed digitally tunable capacitor may include tunable radio frequency oscillators, clock distribution units, local oscillators, down converters, up converters, frequency shift keyed (FSK) modulators, and the like. Additional applications may further include capacitance measurement instruments, such as capacitance bridges, digitally tunable analog filters or coupling circuits, analog to digital (A/D) or digital to analog (D/A) converters, switched capacitor signal conditioners, switching power supplies, power inverters, power factor correction circuits, energy storage elements, and the like.

The resolution of the disclosed digitally tunable capacitor can be increased or the normalized capacitance step size can be decreased, relative to Table 1, by using a more granular PWM waveform, a larger resolution factor, R, or both. For example, 17-ary PWM or 33-ary PWM can be used with R=8 so that the capacitance of a fractional capacitor is 1.125 times the capacitance of the fine capacitors. These exemplary cases correspond to an advantageous 2-bit or 3-bit decrease in the normalized capacitance step size, respectively, relative to the results of Table 1.

The resolution of the disclosed digitally tunable capacitor can be decreased or the normalized capacitance step size can be increased, relative to Table 1, when it is advantageous to do so. For example, it may be advantageous to reduce the complexity or speed of circuits and/or clock signals that comply with this disclosure. Table 3 shows an exemplary data set for 9-ary PWM and a doubling of resolution so that R=2. In this case, the capacitance of a fractional capacitor can be 1.5 times the capacitance of a fine capacitor. As in Table 1, the PWM pulse widths shown in Table 2 are those values for which the capacitance step sizes are substantially equal.

As shown from Table 2, the weighted PWM value can be a weighted sum that increases monotonically with substantially equal step sizes when using PWM signals with a common period. The desired weighted sum PWM value or normalized capacitance can be achieved by selecting a state for each switchable capacitor from the M+1 states of (M+1)-ary PWM signals having a common period. Each (M+1)-ary PWM signal can be have one of M possible nonzero states plus a zero state, thus achieving duty cycles from 0 to 100%.

TABLE 3

PWM Code Pattern for 9-ary PWM and R = 2 resolution increase. The codes shown are those for which the weighted sum PWM and total capacitance step sizes are substantially equal.

| ROW NUMBER | Fractional PWM | 1st PWM | 2nd PWM | Weighted PWM | $C_{Total}/C_0$ |
|---|---|---|---|---|---|
| 1 | 0 | 1 | 0 | 1.0 | 0.125 |
| 2 | 1 | 0 | 0 | 1.5 | 0.188 |
| 3 | 0 | 2 | 0 | 2.0 | 0.250 |
| 4 | 1 | 1 | 0 | 2.5 | 0.313 |
| 5 | 0 | 3 | 0 | 3.0 | 0.375 |
| 6 | 1 | 2 | 0 | 3.5 | 0.438 |
| 7 | 0 | 4 | 0 | 4.0 | 0.500 |
| 8 | 1 | 3 | 0 | 4.5 | 0.563 |
| 9 | 2 | 2 | 0 | 5.0 | 0.625 |
| 10 | 3 | 1 | 0 | 5.5 | 0.688 |
| 11 | 0 | 6 | 0 | 6.0 | 0.750 |
| 12 | 1 | 5 | 0 | 6.5 | 0.813 |
| 13 | 2 | 4 | 0 | 7.0 | 0.875 |
| 14 | 3 | 3 | 0 | 7.5 | 0.938 |
| 15 | 4 | 2 | 0 | 8.0 | 1.000 |
| 16 | 3 or 1 | 4 or 7 | 0 | 8.5 | 1.063 |
| 17 | 2 | 6 | 0 | 9.0 | 1.125 |
| 18 | 3 | 5 | 0 | 9.5 | 1.188 |
| 19 | 4 | 4 | 0 | 10.0 | 1.250 |
| 20 | 5 | 3 | 0 | 10.5 | 1.313 |
| 21 | 4 | 5 | 0 | 11.0 | 1.375 |
| 22 | 3 | 7 | 0 | 11.5 | 1.438 |
| 23 | 4 | 6 | 0 | 12.0 | 1.500 |
| 23 | 1 | 8 | 3 | 12.5 | 1.563 |
| 24 | 2 | 8 | 2 | 13.0 | 1.625 |
| 25 | 3 | 8 | 1 | 13.5 | 1.688 |
| 26 | 2 | 8 | 3 | 14.0 | 1.750 |
| 27 | 3 | 8 | 2 | 14.5 | 1.813 |
| 28 | 4 | 8 | 1 | 15.0 | 1.875 |
| 29 | 3 | 8 | 3 | 15.5 | 1.938 |
| 30 | 4 | 8 | 2 | 16.0 | 2.000 |
| 31 | 3 | 8 | 4 | 16.5 | 2.063 |
| 32 | 2 | 8 | 6 | 17.0 | 2.125 |
| 33 | 3 | 8 | 5 | 17.5 | 2.188 |
| 34 | 4 | 8 | 4 | 18.0 | 2.250 |
| 35 | 5 | 8 | 3 | 18.5 | 2.313 |
| 36 | 4 | 8 | 5 | 19.0 | 2.375 |
| 37 | 3 | 8 | 7 | 19.5 | 2.438 |
| 38 | 4 | 8 | 6 | 20.0 | 2.500 |

The sixteenth row of data in Table 3, for which the total normalized capacitance is 1.063, is an exemplary case that shows the fractional capacitor being driven with a duty cycle of ⅜ and the first fine capacitor being driven with a duty cycle of ⅛$^{th}$. There may be more than one combination of duty cycles that achieves a given total capacitance. The existence of multiple viable solutions is due to the modular nature of the arithmetic that underpins the PWM data pattern and does not diminish the utility of the material disclosed in this application. For example, the fractional capacitor can be driven with a duty cycle of either ⅛ or ⅜ and the first fine capacitor can be driven with a duty cycle of ⅞ or ⅝, respectively. Both the solutions achieve a weighted PWM value of 8.5 and a corresponding total capacitance of approximately 1.063 times the fine capacitance. A preference may be given to code sequences that change by a minimum number of timeslots as the desired capacitance increments or decrements. A pulse generator, such as pulse generator 105, can determine both the desired capacitance and the code sequence and the corresponding duty cycles for which the tunable capacitance can be monotonically increased or arranged in a monotonically increasing sequence.

The PWM code patterns, such as the code patterns shown in Table 1 and Table 3, can be generated by a variety of algorithms. For example, a sequential search can be used, or the extended Euclidean algorithm, linear programming, and the like, can be used. The foregoing and other pattern or modulation code generation algorithms can be used even when the resolution increase factor, R, is not a power of two. In other words, the capacitance ratio between the fractional capacitor and fine capacitors of equal capacitance can be (R+1)/R. Solutions to the pattern or code generation problem can be guaranteed when, the capacitance ratio is exactly or approximately equal to a ratio of mutually prime or co-prime integers.

As disclosed in the discussion of FIGS. 2a and 2b, the fine capacitors can all be unequal in capacitance and can have capacitance ratios that are approximately or exactly mutually prime. In this case, a given desired or total capacitance, $C_{TOTAL}$, can be achieved by simultaneously pulse width modulating more than two fine capacitors as well as the fractional capacitor or pulse width modulating the entire set of fractional and fine capacitors. When the entire set of fractional capacitor and fine capacitors have capacitances that are mutually prime or co-prime, the total or desired capacitance can be achieved by using PWM code patterns that can be obtained from the Chinese Remainder Theorem.

The Chinese Remainder Theorem can be used take a set of remainders from counting problems with a given set of coprime moduli and find which numbers have the same remainders. In other words, the Chinese Remainder Theorem is a statement about simultaneous congruences. The remainders can be the number of PWM timeslots used in a digitally tunable capacitor that have co-prime relations between fine capacitors and the fractional capacitor. Using the Chinese Remainder Theorem, the capacitance ratios, which can be measured and converted to mutually prime numbers, can be used to find residuals that correspond to the duty cycle of each capacitor. These residuals can be tabulated and the table can be sorted so that the weighted PWM value and the total capacitance can be given in a monotonically increasing order. The PWM patterns can be stored in a pulse generator, such as pulse generator 105, and used to adjust the total capacitance of a digitally tunable capacitor, such as digitally tunable capacitor 100.

Figure 3:
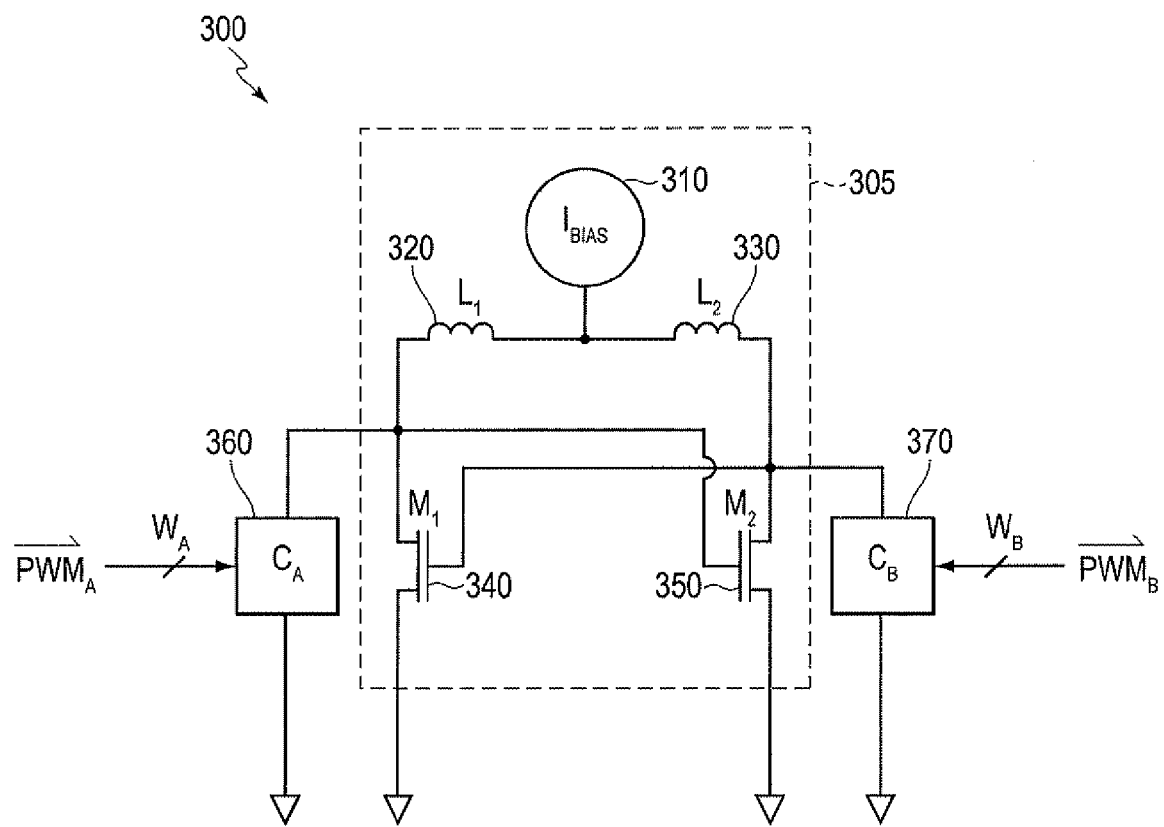
FIG. 3 is a diagram of an exemplary tank oscillator circuit containing a current bias source, inductors $L_1$ and $L_2$, transistors $M_1$ and $M_2$, capacitive load $C_A$, and capacitive load $C_B$.

FIG. 3 is a diagram of an exemplary tank oscillator circuit 300 containing a current bias source 310, inductors $L_1$ 320 and $L_2$ 330, transistors $M_1$ 340 and $M_2$ 350, capacitor 360 and capacitor 370, denoted $C_A$ and $C_B$, respectively. The current bias source 310, inductors $L_1$ 320 and $L_2$ 330, and transistors $M_1$ 340 and $M_2$ 350 may collectively be called an oscillator circuit 305.

The tank oscillator circuit 300 can oscillate by exchanging power between an inductor and a capacitor. The frequency of tank oscillator circuit 300 can be adjusted by a digitally tunable capacitor, such as digitally tunable capacitor 100. Either or both capacitor 360 or 370, i.e., $C_A$ or $C_B$, can be digitally tunable capacitors, including a digitally tunable capacitor with a single capacitor and series switch. One of capacitor 360 or 370 can be a fixed capacitor. In other words, capacitor 360 and capacitor 370 can contain a combination of non-switched or switched circuit configurations that can tune two or more individual capacitors in a tank oscillator circuit.

FIG. 3 shows that either or both capacitors 360 and 370 can receive a set or vector of pulse width modulation waveforms, such as $\overline{PWM_A}$, and $\overline{PWM_B}$. The PWM waveforms may be arranged in a bus having $W_A$ bus lines or $W_B$ bus lines, respectively. Each vector of PWM waveforms can be produced by a switch controller, such as switch controller 150.

The tank oscillator circuit 300 can operate by drawing current from the current bias source 310 and reactively coupling signals to the gate of transistors $M_1$ and $M_2$. The reactive network formed from inductor $L_1$ 320 and capacitor 360 can resonate at or near the frequency of tank oscillator circuit 300. Likewise, the reactive network formed from inductor $L_2$ 330 and capacitor 370 can resonate at or near the frequency of tank oscillator circuit 300.

Figure 4:
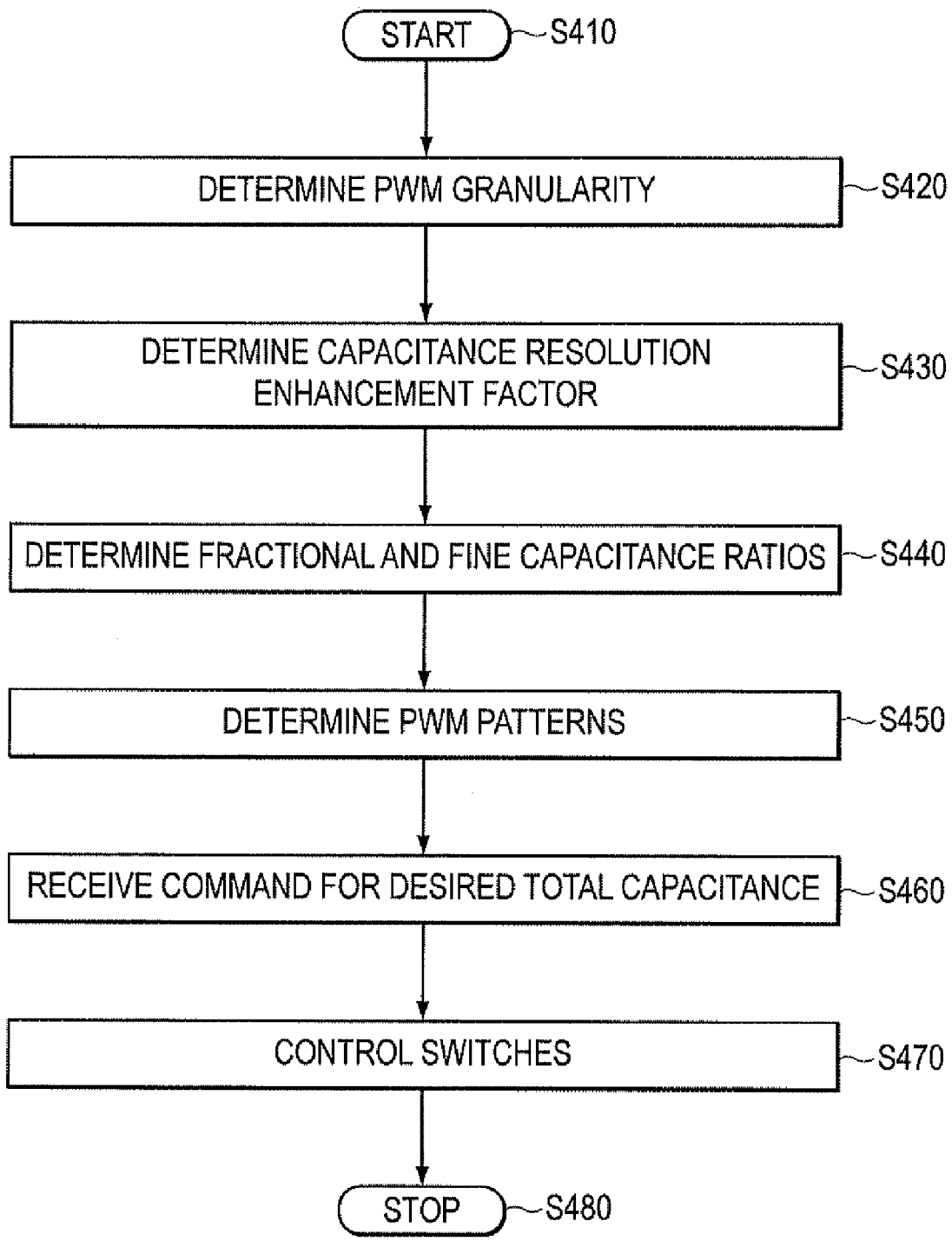
FIG. 4 is a flowchart of an exemplary digitally tunable capacitor method.

FIG. 4 is a flowchart of an exemplary digitally tunable capacitor method 400. The flowchart can begin at step S410 at which point the program execution can begin. The program can flow from step S410 to step S420, which determines the PWM granularity. The granularity can be the number of states, M, in the PWM code for which a time interval or subinterval within a clock period is non-zero. The zero state can be included in the PWM code so if M non-zero states are possible, then M+1 total states are possible for a given PWM pattern. A signal with M+1 total states, e.g., M non-zero time slots and one zero timeslot, can be called an (M+1)-ary PWM signal. The PWM granularity can be an integer and, in particular, can a power of two, e.g., M=2, 4, 8, 16, etc.

From step S420, program flow can proceed to step S430 in which a desired capacitance resolution enhancement factor, R, can be determined. The resolution enhancement can be a relative measure of resolution. The resolution enhancement factor can be a factor that is relative to the capacitance resolution possible when only one value of capacitance is used and the capacitor is switched by a pulse width modulation signal. The desired capacitance resolution factor can, for example, allow for R=2, thus doubling the resolution. In an exemplary case, R=4, 8, 16, 32 or another power of two. The resolution increase factor can also be an integer, such as 3, 4 or more, or a non-integer value. The capacitance resolution enhancement factor R can be any non-integer value that produces a mutually prime relationship between two capacitances, such as a fractional and a fine capacitance, e.g., (R+1)/R, is mutually prime. For example, if a weight ratio (R+1)/R is 11/7, then R can be 7/4 or 1¾.

From program step S430, program flow can proceed to step S440 in which the weight ratio of capacitances for the fractional and fine capacitors can be determined. The capacitor weight ratio can be (1+1/R), where R is as discussed above. More than one value of R, and therefore more than one ratio of fractional and fine capacitance can exist when each pair of capacitors is considered. For example, if there are P fractional capacitors and Q fine capacitors, there can be (P+Q)(P+Q−1)/2 pairs. Each of the (P+Q)(P+Q−1)/2 may or may not be distinct. In an exemplary case, the Q fine capacitors can have the same capacitance. In an exemplary case, if R=2 then there can be one fractional capacitor that has a capacitance of 1.5 times the capacitance of each fine capacitor. In an exemplary case, the fractional capacitor can have a weight ratio that is 1.25 times the capacitance of each fine capacitor, so that R=4.

From step S440, program flow can proceed to step S450 in which the pulse width modulation (PWM) code or pattern is determined. The PWM pattern can be obtained through a sequential search, linear programming, the extended Euclidian algorithm, the Chinese Remainder Theorem, and the like. For example, the PWM code pattern can show a decrement in a fine capacitor PWM code and a corresponding increment in a fractional capacitor PWM code when a tunable capacitance is to be incremented by the difference of the fractional capacitance and a fine capacitance. The PWM code pattern can show codes for which a fractional capacitor is turned completely ON for the modulation period and a fine capacitor is turned completely OFF. The PWM code pattern can show codes for which a fine capacitor is turned completely ON for the modulation period and a fractional capacitor is turned completely OFF.

Any fine capacitor can be turned completely OFF until it is needed or can be turned completely OFF for particular PWM code patterns as the desired capacitance increases. The range of PWM patterns for which the capacitance step sizes are substantially equal can determine the range of PWM patterns to be tabulated and/or stored. The PWM patterns can include patterns for which the capacitance step sizes are unequal, but either approximate the desired total capacitance, up to the limits 0 to M of (M+1)-ary PWM, or implement a monotonic relationship between PWM states and the total capacitance.

From program step S450, program flow can proceed to program step S460 in which a command can be received for implementing a total desired capacitance. The command can be received from an external controller, a lookup table, an automatic frequency control (AFC) circuit, a temperature sensor, and the like. The command for a desired total capacitance can be based on external inputs available to a processor, such as a temperature or power supply voltage compensating input, and the like.

From program step S460, program flow can proceed to step S470 in which a switch controller can control switches via pulse width modulation (PWM) signals. For example, the pulse width modulation waveforms can drive the gates of MOSFETs or other transistors that implement digital switches. Digital switches can connect the switch capacitors such as a fractional capacitor and/or a fine capacitor to a circuit, such as a tunable oscillator circuit, thereby tuning the circuit. It should be clear to one familiar with the art that the pulse width modulation signals may be dithered to broaden, reduce, or eliminate spectral lines that may occur in the circuit at multiples or submultiples of the modulation period.

From program step S470, program flow can proceed to program step S480 where program execution can stop.

While the invention has been described in conjunction with the specific exemplary embodiments thereof, it is evident that many alternatives, modifications, and variations will be apparent to those skilled in the art. Accordingly, embodiments of the invention as set forth herein are intended to be illustrative, not limiting. There are changes that may be made without departing from the spirit and scope of the invention.

What is claimed is:

1. A device, comprising:
 a first switchable capacitor having a first capacitance;
 a second switchable capacitor having a second capacitance, the second switchable capacitor being connected in a parallel circuit with the first switchable capacitor, the parallel circuit having a tunable capacitance; and
 a switch controller that is coupled to the first and second switchable capacitors, the switch controller being configured to switch the first and second switchable capacitors to adjust the tunable capacitance based on first and second (M+1)-ary pulse width modulated signals, (M being a positive integer), respectively, with each of the first and second (M+1)-ary pulse width modulated signals supplied by the switch controller; and
 an offset switchable capacitor having an offset capacitance, the offset switchable capacitor being coupled to the switch controller and in parallel with the first switchable capacitor, wherein the switch controller generates an offset pulse width modulation signal to turn on the offset switchable capacitor for a full modulation period.

2. The device of claim 1, further comprising:
 a pulse generator that is coupled to the switch controller, the pulse generator being configured to generate the first and second (M+1)-ary pulse width modulated signals to cause the tunable capacitance of the parallel circuit to have a pre-determined value.

3. The device of claim 1, wherein, when the switch controller switches the offset switchable capacitor ON, the tunable capacitance substantially equals a sum of the offset capacitance, the first capacitance times a first duty cycle of the first (M+1)-ary pulse width modulated signal, and the second capacitance times a second duty cycle of the second (M+1)-ary pulse width modulated signal.

4. The device of claim 3, wherein the offset capacitance is an integer multiple of the first capacitance.

5. The device of claim 1, wherein each of the switchable capacitors further comprises a capacitor coupled in series with a switch.

6. The device of claim 1, wherein the offset switchable capacitor receives the offset pulse width modulation signal from the switch controller, the offset pulse width modulation signal having a same modulation period as the first and second (M+1)-ary pulse width modulated signals.

7. The device of claim 1, wherein a ratio of the second capacitance and the first capacitance is substantially equal to a ratio of mutually prime integers.

8. The device of claim 7, wherein the ratio of mutually prime integers is (R+1)/R, where R is an integer.

9. The device of claim 1, wherein the switch controller adjusts the tunable capacitance of the parallel circuit at greater than 2*M+1 steps of resolution.

10. The device of claim 1, wherein the second capacitance is larger than the first capacitance.

11. An apparatus, comprising:
 a tunable oscillator circuit that is configured to resonate substantially at a tunable oscillator period;
 a first switchable capacitor having a first capacitance;
 a second switchable capacitor having a second capacitance, the second switchable capacitor being connected in parallel with the first switchable capacitor to form a parallel circuit, the parallel circuit being coupled to the tunable oscillator circuit and having a tunable capacitance;
 a switch controller that is coupled to the first and second switchable capacitors, the switch controller being configured to switch the first and second switchable capacitors to adjust the tunable capacitance based on first and second (M+1)-ary pulse width modulated signals, (M being a positive integer), respectively, with each of the first and second (M+1)-ary pulse width modulated signals supplied by the switch controller; and
 an offset switchable capacitor having an offset capacitance, the offset switchable capacitor being coupled to the switch controller and in parallel with the first switchable capacitor, wherein the switch controller generates an offset pulse width modulation signal to turn on the offset switchable capacitor for a full modulation period.

12. The apparatus of claim 11, further comprising:
 a pulse generator that is coupled to the switch controller, the pulse generator being configured to generate the first and second (M+1)-ary pulse width modulated signals to cause the tunable capacitance of the parallel circuit to have a pre-determined value.

13. The apparatus of claim 11, wherein, when the switch controller switches the offset switchable capacitor ON, the tunable capacitance substantially equals a sum of the offset capacitance, the first capacitance times a first duty cycle of the first (M+1)-ary pulse width modulated signal, and the second capacitance times a second duty cycle of the second (M+1)-ary pulse width modulated signal.

14. The apparatus of claim 13, wherein the offset capacitance is an integer multiple of the first capacitance.

15. The apparatus of claim 11, wherein each of the switchable capacitors further comprises a capacitor coupled in series with a switch.

16. The apparatus of claim 11, wherein the offset switchable capacitor receives the offset pulse width modulation signal from the switch controller, the offset pulse width modulation signal having a same modulation period as the first and second (M+1)-ary pulse width modulated signals.

17. The apparatus of claim 11, wherein a ratio of the second capacitance and the first capacitance is substantially equal to a ratio of mutually prime integers.

18. The apparatus of claim 17, wherein the ratio of mutually prime integers is (R+1)/R, where R is an integer.

19. The apparatus of claim 11, further comprising:
a third switchable capacitor, coupled to the tunable oscillator circuit and the switch controller, the third switchable capacitor having a third capacitance, the switch controller switching the third switchable capacitor with a third (M+1)-ary pulse width modulated signal.

20. The apparatus of claim 19, further comprising
a fourth switchable capacitor, coupled to the tunable oscillator circuit, the fourth switchable capacitor having a fourth capacitance that is larger than the third capacitance, the fourth switchable capacitor being connected in a next parallel circuit with the third switchable capacitor, the next parallel circuit having a next tunable capacitance, the switch controller switching the fourth switchable capacitor with a fourth (M+1)-ary pulse width modulated signal.

21. The apparatus of claim 11, wherein the second capacitance is larger than the first capacitance.

22. A method of adjusting a tunable capacitance, comprising:
generating a first (M+1)-ary pulse width modulation signal and a second (M+1)-ary pulse width modulation signal (M being a positive integer) having a first and a second duty cycle, respectively, and an offset modulation signal using a switch controller; and
switching a first and a second switchable capacitor with the first and second (M+1)-ary pulse width modulation signals, respectively, by the switching controller, to adjust a tunable capacitance, the switch controller being coupled to the first and second switchable capacitors, the first and second switchable capacitors having a first capacitance and a second capacitance, respectively, the first switchable capacitor being disposed in parallel with the second switchable capacitor, the first switchable capacitor being in parallel with an offset switchable capacitor having an offset capacitance, the first and second capacitance having a weight ratio that is substantially equal to a ratio of mutually prime integers, wherein the switch controller generates an offset pulse width modulation signal to turn on the offset switchable capacitor for a full modulation period.

23. The method of claim 22, further comprising:
generating a sequence of the first and second duty cycles that monotonically increases the tunable capacitance.

24. The method of claim 23, further comprising:
selecting the first and second duty cycles from the sequence of first and second duty cycles based on a desired capacitance.

25. The method of claim 23, wherein the sequence of first and second duty cycles includes sub-sequences in which the second duty cycle decreases when the first duty cycle increases.

26. The method of claim 25, wherein an increase in the first duty cycle is 1/M.

* * * * *